United States Patent [19]

Ueberreiter et al.

[11] Patent Number: 5,125,503

[45] Date of Patent: Jun. 30, 1992

[54] APPARATUS FOR TESTING ELECTRONIC COMPONENTS HAVING A LOADING STATION A TESTING STATION AND AN UNLOADING STATION FOR THE COMPONENTS

[75] Inventors: Ekkehard Ueberreiter, Drosselweg 14, D-8201 Raubling/FRD; Josef Gentischer, Remshalden, both of Fed. Rep. of Germany

[73] Assignee: Ekkehard Ueberreiter, Remshalden, Fed. Rep. of Germany

[21] Appl. No.: 510,025

[22] Filed: Apr. 17, 1990

[30] Foreign Application Priority Data

Apr. 17, 1989 [DE] Fed. Rep. of Germany ....... 3912589

[51] Int. Cl.⁵ .............................................. B65G 37/00
[52] U.S. Cl. .......................... 198/803.01; 198/803.14
[58] Field of Search ........... 198/345.2, 803.01, 803.14, 198/803.15; 414/217; 340/62, 676; 29/33 P

[56] References Cited

U.S. PATENT DOCUMENTS

| | | | |
|---|---|---|---|
| 3,610,407 | 10/1971 | Prodzenski | 198/803.01 |
| 3,645,581 | 2/1972 | Lasch, Jr. et al. | 198/493 X |
| 3,944,048 | 3/1976 | Greshaeu et al. | 198/493 X |
| 4,149,620 | 4/1979 | Roseensweig | 198/345.2 |
| 4,193,186 | 3/1980 | Boehler | 198/345.2 X |
| 4,277,954 | 7/1981 | Drummond | 198/952 X |
| 4,304,508 | 12/1981 | Wolf | 198/493 X |
| 4,527,942 | 7/1985 | Smith . | |
| 4,547,343 | 10/1985 | Takano et al. | 198/803.01 X |
| 4,589,815 | 5/1986 | Smith . | |
| 4,694,964 | 9/1987 | Ueberreiter . | |
| 4,817,785 | 4/1989 | Farber | 198/803.01 |
| 4,908,126 | 3/1990 | Willberg et al. . | |
| 4,946,021 | 8/1990 | Murphy | 198/803.01 X |
| 5,007,527 | 4/1991 | Ach et al. | 148/803.01 |

FOREIGN PATENT DOCUMENTS

| | | |
|---|---|---|
| 0102217 | 8/1983 | European Pat. Off. . |
| 3615941 | 11/1987 | Fed. Rep. of Germany . |
| 3615942 | 11/1987 | Fed. Rep. of Germany . |
| 3719148 | 12/1988 | Fed. Rep. of Germany . |
| 3340183 | 5/1990 | Fed. Rep. of Germany . |
| 57-22570 | 2/1982 | Japan . |
| 57-199965 | 12/1982 | Japan . |
| 61-228362 | 10/1986 | Japan . |
| 0986838 | 1/1983 | U.S.S.R. ............ 198/803.01 |

Primary Examiner—D. Glenn Dayoan
Attorney, Agent, or Firm—Scully, Scott, Murphy & Presser

[57] ABSTRACT

The invention relates to an apparatus for testing electronic components, in particular IC's, having a transporting device to which holders for the components are detachably attached by fastening devices, and which is passed through a loading station to receive the components, a testing station to test the components and an unloading station to remove the components. To generally improve the functional efficiency of the apparatus and to carry out in particular the loading and unloading procedure with less danger of damaging the components, it is proposed according to the invention to provide that the holder, together with the components, can be attached to the transporting device in the loading station and be removed therefrom in the unloading station.

5 Claims, 7 Drawing Sheets

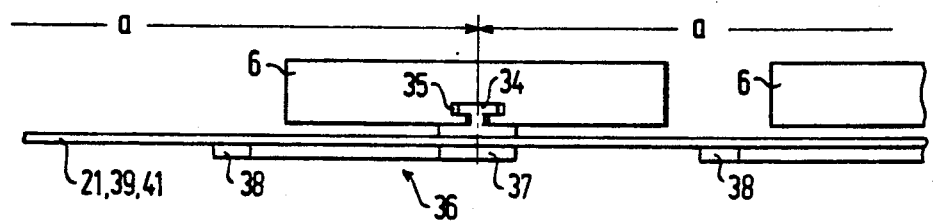
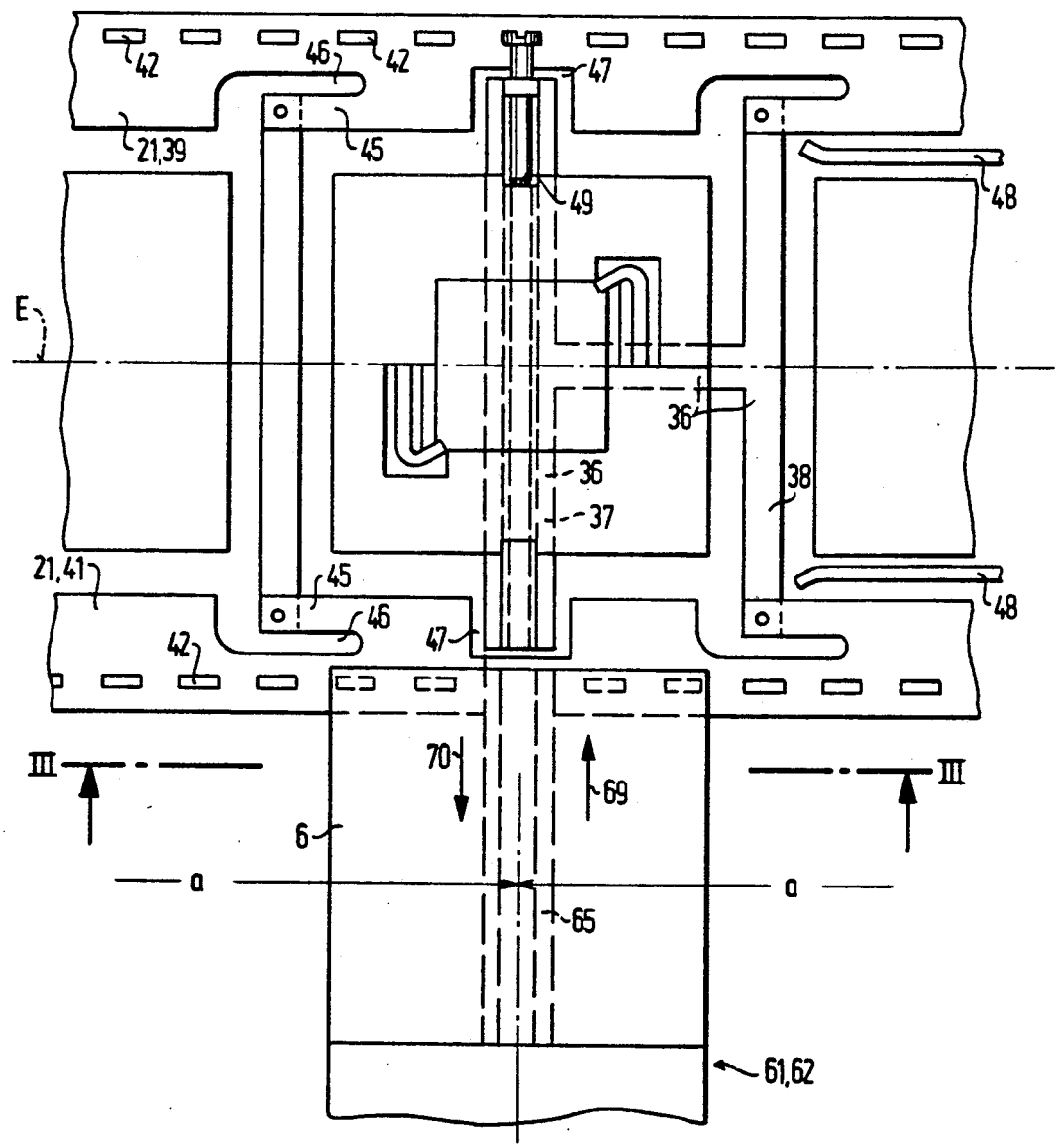

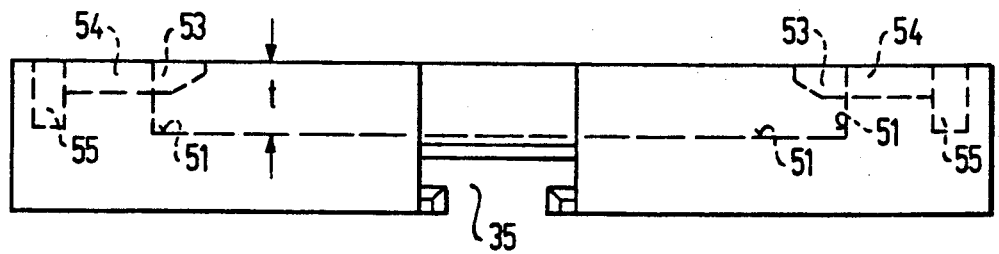
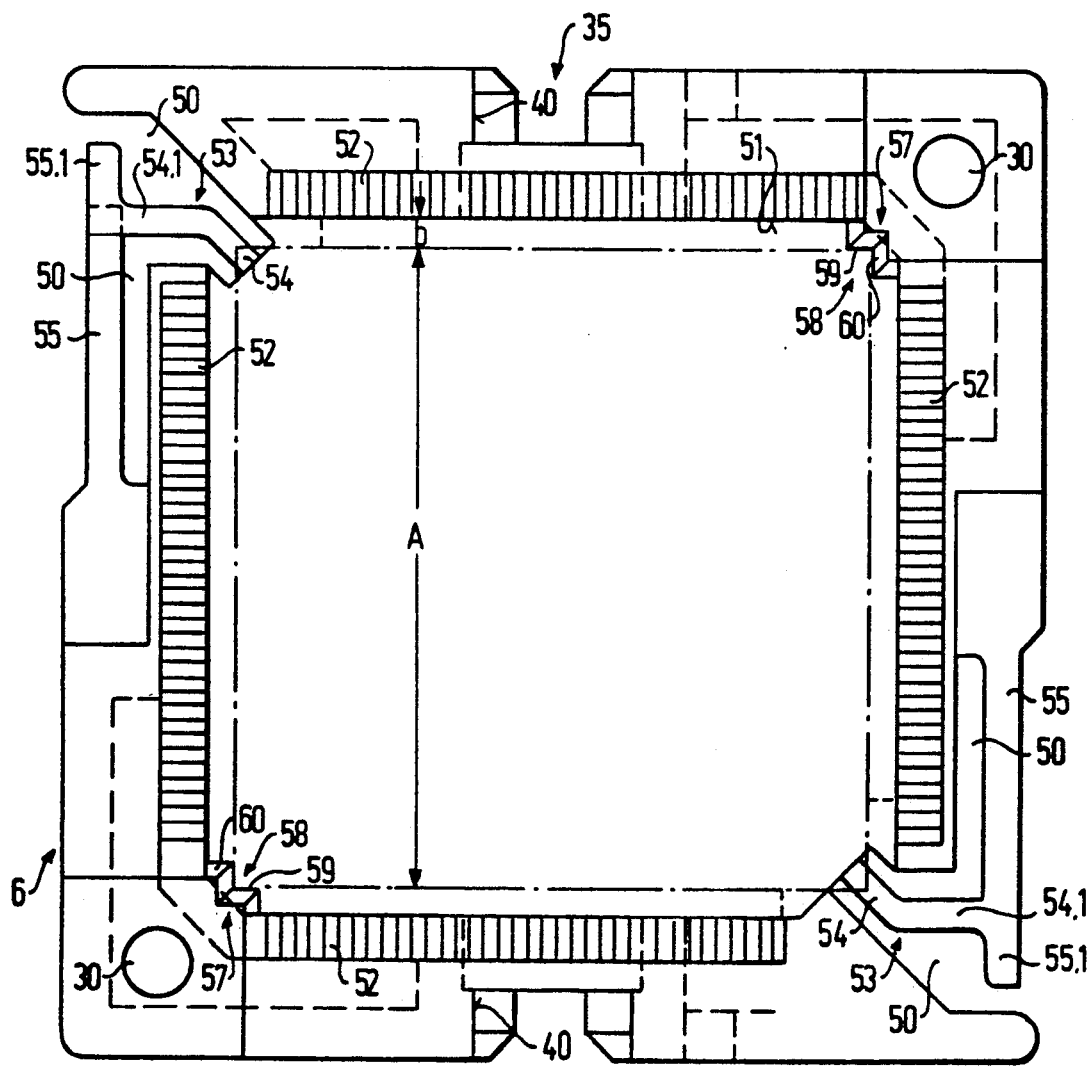

APPARATUS FOR TESTING ELECTRONIC COMPONENTS HAVING A LOADING STATION A TESTING STATION AND AN UNLOADING STATION FOR THE COMPONENTS

TECHNICAL FIELD OF THE INVENTION

The present invention relates to an apparatus for testing electronic components, such as integrated circuits, including a transport device to which holders for the components are detachably fastened by fastening means, and which is passed through a loading station to receive the components, a testing station for testing the components, and an unloading station for removing the components.

BACKGROUND OF THE INVENTION AND PRIOR ART

An apparatus of this kind is described and illustrated in DE-OS 37 19 148. In this known embodiment the components are conveyed to and from the testing station by transporting means, and while being conveyed the components are accommodated in holders attached exchangeably to the transporting means.

The transporting means comprises an endless flat belt which runs in a horizontal plane about two wheels rotatable in a horizontal plane and carries the holders by which the components are transported from the loading station to the testing station and from there to the unloading station spaced uniformly from one another on its vertical outer surface The holders each have a vertical shaft into which at the loading station the associated component slides under gravity from a bar magazine arranged above it. At the unloading station the lower end of the shaft is opened so that the tested component can slide down into a guide passage, likewise under gravity, which leads to a bar magazine. Since the components are of different shapes and sizes, a corresponding number of types of holder with component-specific shaft forms are needed to receive them. If necessary holders of one type attached to the transporting means are exchanged for holders of another type.

The functional efficiency of the known apparatus suffers from the fact that loading the transporting means with the components is associated with a risk of damaging the components. This danger arises both when feeding the components into the bar magazine and when loading the transporting means with the components, when the first component must always be moved forwards while at the same time the second component must be held back. This is effected by separating devices and/or arresting devices for the components. The danger of causing damage naturally also exists in a similar way when unloading the components. It must be taken into consideration that electronic components are delicate prefabricated parts such that every active mechanical contact involves the risk of damage. In the case of IC's there is a danger of bending the small and delicate connection contacts. It must also be taken into consideration that electronic components such as IC's are difficult to handle when loading and unloading because of their complicated structure.

It is known from DE-OS 36 38 430 to grasp IC's by means of a movable gripper and convey them to a tester. Even with this arrangement damage to the IC's cannot be excluded.

OBJECT OF THE INVENTION

It is an object of the invention to further develop an apparatus of the kind described in the introduction so that its functional efficiency is generally improved and that in particular the loading and unloading procedure can be carried out with less danger of damaging the components.

SUMMARY OF THE INVENTION

According to the invention the holders, each filled with one component, are loaded at the loading station on to the transporting means, conveyed to the testing station to be tested there, then transported away and unloaded again at the unloading station. During these procedures the components are protectively arranged in the holders so that damage is excluded. The holders on the other hand are robust parts which, during loading and unloading, do not need to be treated with great care as they are moved forwards, accelerated, arrested or the like.

The attaching means preferably comprise engagement elements in the form of tongue and groove elements which enable loading and unloading to be performed simply and quickly and to be automated by using guide elements of the same kind and of the same cross-sectional dimensions.

The transporting means can comprise a belt arrangement, for example in the form of a belt or two flat belt strips running spaced from and parallel to one another.

To temper the components, i.e. to bring them to the temperature required for testing at the testing station, the transporting means preferably runs in loops over a set of rollers through an air-conditioned chamber to the testing station at the end thereof. After the testing station it may then run in loops over a further set of rollers through an acclimatization chamber.

The loops can be open loops through which the transporting means runs over rollers successively rotating in opposite senses. It is advantageous if at least those rollers which face the side of the transporting means carrying the holders are each formed with a peripheral groove as a space for the holders to dip into.

The loops are preferably closed loops through which the transporting means runs along spiral paths over rollers rotating in the same direction. In this way it is possible to use, instead of a comparatively complicated belt arrangement, a simple commercially available link chain with carrier lugs or tongues to which the first engagement elements are attached. Instead of having rollers with a peripheral groove into which the holders can dip, simple rollers or simple toothed wheels can be used when the holders are always arranged on the side of the transporting means remote from the rollers or toothed wheels.

The holders can be adapted to the shape and size of different components so that they perform, so to speak, the function of adapters by which different components can be loaded on to and removed from one and the same transporting means. According to a further development of the invention the first engagement elements are attached detachably to the transporting means and can thus be used in addition to or instead of the holders as adapters which are adapted to the different holder but are always attached to the transporting means in the same way.

Advantageous modifications of the invention, which improve the loading, the unloading and the testing functions and which ensure reliable functioning with a simple and economical construction are described in the other subclaims.

BRIEF DESCRIPTION OF THE DRAWINGS

The invention will now be described in more detail with reference to preferred exemplary embodiments shown in the drawings, in which:

FIG. 2 shows the detail of the first embodiment indicated by X or Y in FIG. 1 on a larger scale and in plan.

FIG. 3 shows a partial view on the line III—III in FIG. 2,

FIG. 6 shows a holder of the apparatus in plan view,

FIG. 7 shows the holder in front elevation,

DETAILED DESCRIPTION OF PREFERRED EMBODIMENTS OF THE INVENTION

Figure 1:
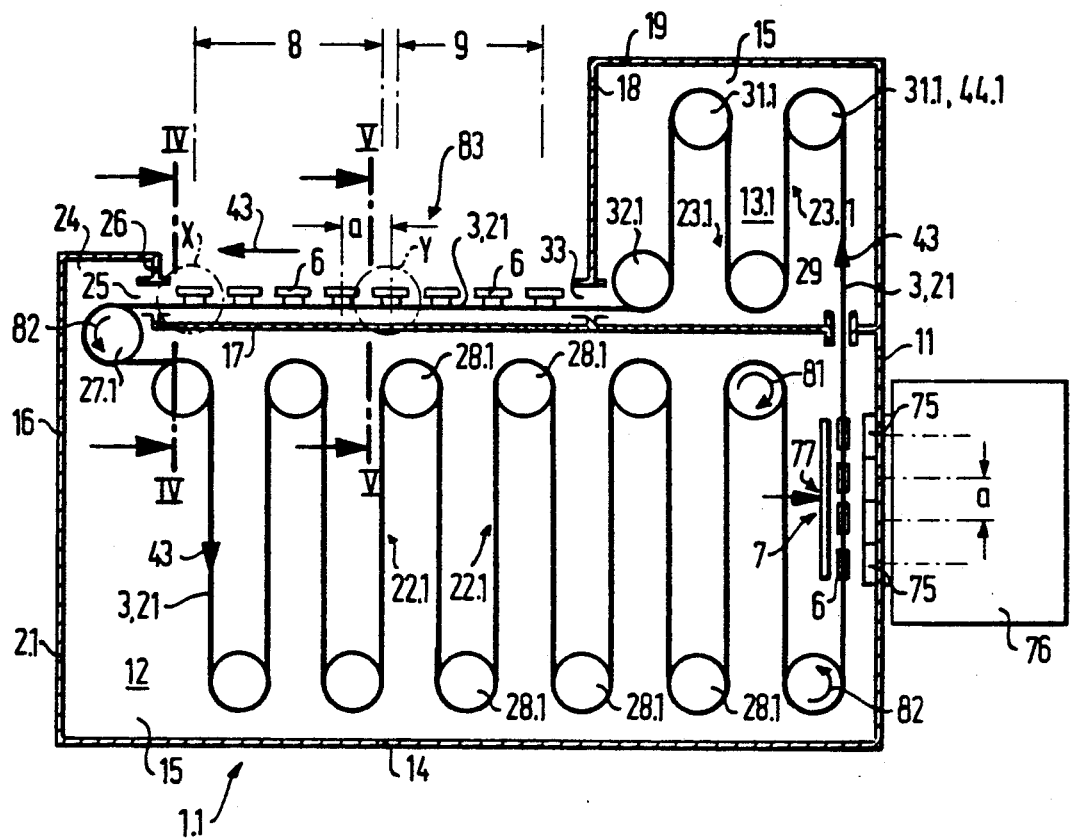
FIG. 1 shows a side elevation of an apparatus according to the invention for testing electronic components according to a first exemplary embodiment.

The essential parts of the apparatus 1.1 shown in FIG. 1 are a box-shaped, oblong housing 2.1 in which a transporting means 3 circulates past a loading station 8, at which holders 6 carrying electronic components, in particular IC's 5, to be tested are loaded on to the transporting means 3, a testing station 7 for testing the IC's 5 and an unloading station 9 for unloading the holder 6 from the transporting means 3.

The testing station 7 is located on the vertical end wall 11 of the housing 2.1 which is remote from the loading station 8, so that the transporting means 3 runs along a relatively long stretch between the loading station 8 and the testing station 7. This is desirable if the IC's have to be at a certain temperature when being tested, which can be either below or above room temperature.

For this purpose the housing 2.1 has an air-conditioned chamber 12 and an acclimatization chamber 13.1. The air-conditioned chamber 12 is formed by the lower cuboidal part of the housing 2.1, comprising a floor wall 14, vertical side walls 15 facing one another, the end wall 11, a vertical end wall 16 facing it and a top wall 17. The acclimatization chamber 13.1 is located at the right-hand end of the housing 2.1, i.e. above the testing station 7, on the housing 2.1 and is separated by the right-hand part of the top wall 17 from the air-conditioned chamber 12. Its end and side walls are formed by an upward extension of the end wall 11, a facing end wall 18, upward extensions of the side walls 15 and a horizontal top wall 19 connecting these walls together.

The transporting means 3 is, according to a first embodiment, an endless flat belt 21, preferably of steel, which runs in a vertical plane E round a plurality of rollers which are spaced uniformly apart and can rotate freely about axes of rotation extending horizontally transverse to the side walls 15, thus forming in both the air-conditioned chamber 12 and the acclimatization chamber 13.1 vertical open, meander-like loops 22.1, 23.1 to increase the transporting time in the air-conditioned chamber 12 and in the acclimatization chamber 13.1 so that reliable tempering and a final tempering can occur without shock.

The holders 6 are held on the flat belt 21 at uniform distances a from one another by attachment means comprising first and second engagement elements engaging one within the other which enable the holder 6 to be loaded on to the flat belt 21 at the loading station 8 and unloaded at the unloading station 9. The engagement elements can be engaged or disengaged by a linear displacing movement of the respective holder 6 transverse to or at right angles to the flat belt 21. In the present exemplary embodiment the direction of this sliding movement is horizontal and at right angles to the vertical plane E, and this displacing movement is also parallel to the flat belt 21.

The loading and the unloading stations 8, 9 are located between the acclimatization chamber 13.1 and an extension 24 arranged at the left-hand end of the housing, on the top wall 17 of the air-conditioned chamber 12, in a chamber 83, open at the top, through which the flat belt 21 runs in a horizontal plane. In doing so it passes through a horizontal slit 25 in the right-hand wall 26 of the extension into the housing extension 24, is there deflected downwards by a first horizontal lead-out roller 27.1 arranged at a corresponding height, then runs meander-fashion over a plurality of upper and lower rollers 28.1 arranged so that they are mutually offset longitudinally of the housing, into the vertical open loops 22.1, the last of these rollers 28.1 being located near the lower right-hand corner of the air-conditioned chamber 12 so that the flat belt 21 runs from this roller 28.1 approximately parallel to the end wall 16, past the testing station 7, vertically upwards through a corresponding slit 29 in the top wall 17. In the acclimatization chamber 13.1 it likewise winds in a figure S, meander-fashion in the vertical, open loops 23.1 around a plurality of upper and lower horizontal rollers 31.1, of which the last roller, indicated by 32.1, is arranged as a lead-in roller to the open chamber 83 in the region of the lower left-hand corner of the acclimatization chamber 13. It then runs through a slit 33 arranged at an appropriate height and horizontally to the loading and unloading stations 8, 9, in the region of which it can be supported vertically by sliding rails. The clockwise direction of rotation 81 of the rollers 28.1 in the upper row in the air-conditioned chamber 12 is opposite to the direction of rotation 82 of the rollers 28.1 in the lower row. The same applies to the rollers 28.1 in the acclimatization chamber 13.1 except that the directions of rotation 81, 82 are inverted. The lead-out roller 27.1 rotates counter-clockwise 82 as the transporting means moves. The rollers 28.1 in the air-conditioned chamber 12 form a first set of rollers and the rollers 31.1, 32.1 in the acclimatization chamber 13.1 form a second set of rollers.

In the present embodiment the first and second engagement elements 34, 35 respectively comprise a T-shaped rib member 34 on the flat belt 21, with lateral projections, and a correspondingly T-shaped groove element 35 on the holder 6, having recesses corresponding to the projections of the rib element and preferably having bevelled lead-in edges with which it can be pushed on to the rib element 34, as is shown more clearly in FIGS. 2 and 3. The rib elements 34 and thus the holder 6 carried thereon are held movably on and transverse to the flat belt 21 so that in regions where the flat belt changes direction the flat belt holding parts 36 holding the holder 6 can move transversely to the flat belt and can thus be adapted transversely thereto. In the present exemplary embodiment an H-shaped holding part 36 is provided of which one limb 37 extends transverse to the vertical plane E and carries the rib element 34, and the other limb 38 is connected to the flat belt 21, the limb 37 thus being attached to the flat belt 21 so that it can pivot about the limb 38.

In the present exemplary embodiment, for economy of material two flat belt strips 39, 41 circulating parallel to one another are provided which have engagement holes 42 spaced uniformly from one another into which teeth arranged at least on the driving roller engage. In the present construction the roller following the testing station in the direction of passage 43 is the driving roller 44.1, which in this case is located in the upper right-hand corner of the acclimatization chamber 13.1. The roller 27.1 is preferably also driven at the same speed as or is coupled mechanically to the driving roller 44.1.

The other limb 38 parallel to the rib element 34 is connected at its ends, for example, by screws, rivets or welds, to tongues 45 of the flat belt strips 39, 41 extending longitudinally of the flat belt 21, the tongues being formed by angular slit cut-outs 46 in the flat belt strips 39, 41. So that larger holders 6 for larger IC's 5 can also be received with the same embodiment of the rib elements 34 and groove elements 35, the rib elements 34 are longer than the holders 6, cut-outs 47 being provided facing one another on the sides of the flat belt strips 39, 41 which can receive the free ends of the limb 37 or of the rib element 34. A space is made in the rollers by a central peripheral groove into which the holding parts 36 can move. To limit the loading movement a respective limiting stop 49 is provided at the end of each rib element 34 remote from the loading movement, which is preferably adjustable and here comprises an adjustment screw arranged parallel to the rib element 34 which passes through a threaded hole in an attachment on the rib element 34. Associated with each holding part 36 is a securing element (not shown for simplicity) to secure the holder in the mounted loading position. This can also be a clamping member (not shown). A securing element of this kind can also be formed by lateral guide rails 48 which are preferably adjustable laterally, have lead-in bevels and can extend along the entire path of circulation except at the loading and unloading stations 8, 9.

Figure 8:
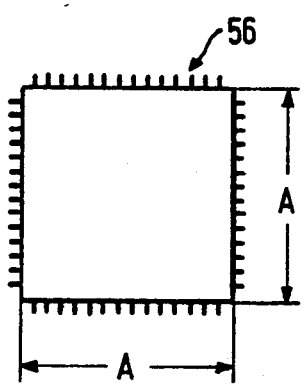
FIG. 8 shows an electronic component in a plan view.
Figure 9:
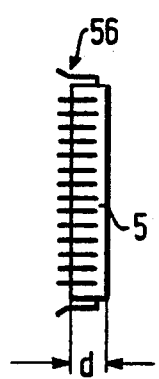
FIG. 9 shows the electronic component in side elevation.
Figure 4:
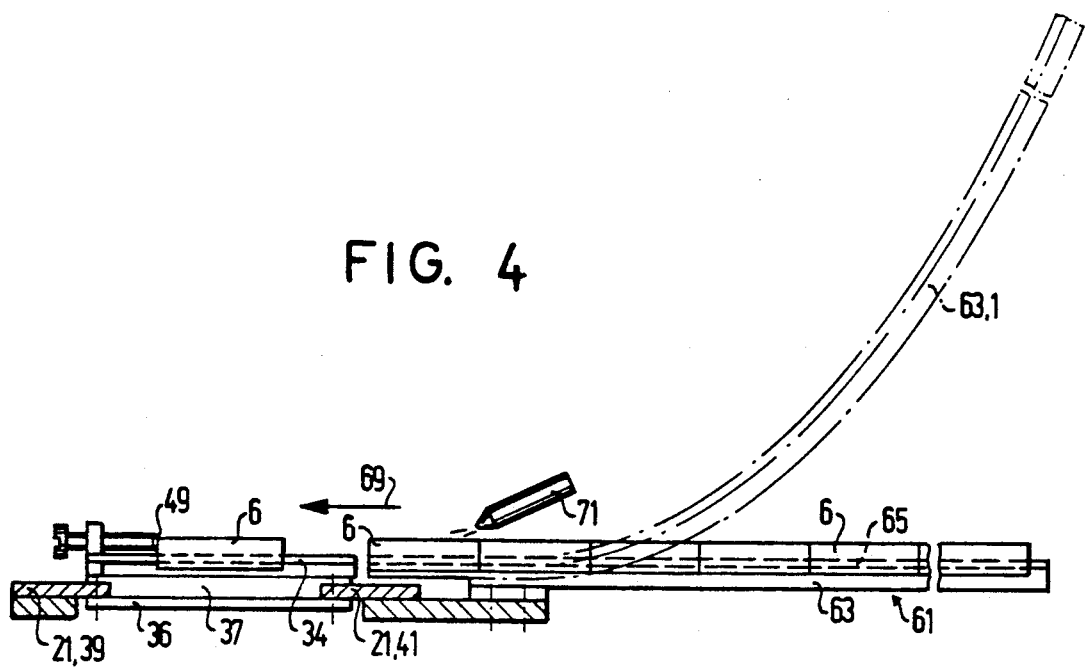
FIG. 4 shows the partial section IV—IV in FIG. 1.
Figure 5:
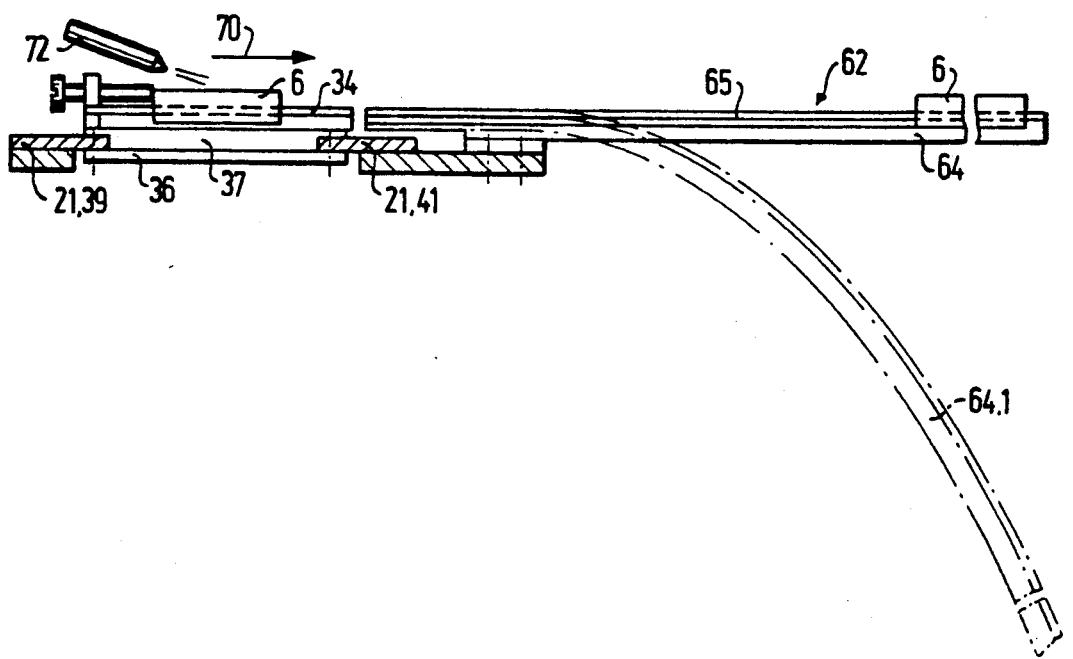
FIG. 5 shows the partial section V—V in FIG. 1.

The holders 6 comprise identical, laminar elements of rectangular shape that are arranged flat on the flat belt 21 and have a groove element 35 extending centrally and longitudinally across their undersides and a vertical shaft 51 to receive the IC's 5. The depth t of the shaft 51 corresponds approximately to the thickness d of the IC's 5. The shaft is adapted to the peripheral shape of the IC's 5, here in the form of flat quadrangular bodies 40. These have, except on their corners, contact elements 56 in the form of wires extending transverse to the peripheral surface (cf. FIGS. 8 and 9). The contact elements 56 are located on the upper or belly side of the IC's 5 and in the inserted position of the IC's they project into recesses or channels 52 at the edge of the shaft 51 extending transverse to the periphery of the shaft 51, where they are received reliably and without damage. To prevent the IC 5 from falling out of the shaft 51 it is secured by two flexible securing arms 53 which project into the shaft 51 diagonally through openings in the shaft wall at two opposed corners of the shaft 51 and in doing so slightly overlap the associated corners of the IC 5, preferably with inclined surfaces. The securing arms 53 each have a diagonal arm member 54 and an arm member 55, preferably extending integrally from the body of the holder 6, parallel to the periphery of the holder 6 and thereby forming an acute angle with the arm member 54. The arm members 55 are extended beyond arm member elements 54.1 which extend at right angles to the arm members 55. The extensions are indicated by 55.1. The holders 6 preferably consist of plastics material and are integral pressure cast or injection moulded parts which have several recesses or spaces therein to reduce the weight. The elastically flexible securing arms 53 are also arranged in such spaces 50.

Associated with the shaft 51 is a separate vertical guide for the IC's 5 to avoid damaging the contact elements 56 that are arranged on the IC's 5, except on the corners, when inserting them into the holder 6 or when removing them. For this purpose a gap b is provided between the opposing shaft walls and the periphery of the IC 5. At each of the two other corners, situated between the securing arms 53, there is a vertical guide projection 57 having a vertical angular groove element 58, the shape and distance apart of the grooves corresponding to the shape of and distance between the associated corners or the dimension A of the IC 5, with allowance for clearance. As a result the IC 5 is only guided at the two angular guide flanks 59, which are preferably chamfered on their upper sides, and thus only in the region of the corner or corners where there are no contact elements 56. The guide flanks 59 have on their upper sides leading-in slopes 60. In the region of the opposed corners of each holder 6 that do not include the securing arms 53 there is a respective circular centering hole 30 to centre the holder 6 at the delivery position 12, in which pointed vertical centering pins on grippers engage with clearance. At each end of the groove element 35 the holder 6 is hollowed out upwards by a respective recess 40. This is advantageous not only for injection moulding techniques but also because a space is formed for centering tools on the grippers to centre the IC 5 at the transfer position.

Arranged at the loading station 8 and at the unloading station 9 are a loading magazine 61 and an unloading magazine 62 respectively which are aligned with the rib elements 34 so that loading is possible from the loading magazine 61 directly on to the associated rib element 34 and unloading from the associated rib element 34 directly into the unloading magazine 62. The magazines 61, 62 preferably have guide elements corresponding to the engagement elements of the flat belt 21 and the holder 6. Bar magazines are provided which receive the holders 6 by guidance in the groove elements 35 and comprise magazine bars 63, 64 having guide ribs 65, the cross-section of which corresponds to the rib elements 34 on the flat belt 21. The magazine bars 63, 64, extending straight or horizontally, can be identical. Loading magazine bars 63.1 curved slightly upwards and unloading magazine bars 64.1 curved slightly downwards can also be provided, each having a horizontal connection limb and a storage limb bent slightly upwards or downwards through about 45° from the connection limb. Stop or arresting elements can be associated with the loading and/or unloading magazine bars 63, 64 at the loading and/or unloading end to temporarily hold the respective foremost and/or rearmost holder 6 so that the holders 6 do not slide out. The magazine bars 63, 64 are supported indirectly or directly on the housing 2 and held by support legs (indicated in outline), in a position aligning with the rib element 35 and are preferably fixed by means of a snap-lock connection so that they can be exchanged easily when they are empty or full.

Compressed air nozzles 71 and 72 are preferably provided to displace the holders 6 when loading or unloading respectively. These point, as the case may be, approximately in the loading direction of displacement 69 or the unloading direction of displacement 70 and at the stream that is directed towards the respective holder 6 and displaces it for the purpose of loading or unloading. A compressed air generating source and appropriate control means are not shown for simplicity. The compressed air nozzles 71, 72, like the magazine bars 63, 64, are preferably adjustable but are otherwise held stationary indirectly or directly on the housing 2.1. Shooting the holders 6 on or off by means of compressed air is advantageous not only because of the speed obtained thereby but also, in particular when loading, because the compressed air stream gives reliable abutment of the holder 6 against the associated loading limiting stop 49.

In the region of the testing station 7 the holder 6 is always in a vertical position in which the opening of its shaft 51 is open towards the contact part 75 of the associated tester and thus the contact part 75 with associated contacts can contact the connection contacts of the respective IC 5. This contact can be effected by movement of the holder 6 or the flat belt 21 at right angles to the flat belt 21 towards the contact part 75 or by corresponding movement of the contact part 75 towards the flat belt 21. In the present embodiment the flat belt 21 or the respective holder 6 is pushed towards the contact part 75 by means of a pusher element 77 (shown in outline) movable back and forth and arranged on the side of the flat belt 21 remote from the contact part 75, the backward movement occurring automatically owing to the tension in the flat belt 21. The contact part 75 and/or the tester 76 can be held rigidly on the end wall 11 or, for the reasons mentioned above, can be held movably transverse to the flat belt 21.

When in functional operation the flat belt 21 is moved forwards intermittently by the distance a between the holders 6 or the rib elements 34 so that there is a respective holder 6 in the loading station 8, the testing station 7 and the unloading station 9. In passing through the apparatus the holders 6 thus move from the loading station 8 to the testing station 7, where the result of the test is registered, and to the unloading station 9. The bar magazines 63, 64 can be connected to a continuous circuit so that it is not necessary to exchange empty or full bar magazines 63, 64.

In the present embodiment there are four loading bar magazines 63 at the loading station, four contact parts 75 at the testing station and four unloading bar magazines 64 at the unloading station, each with loading and unloading compressed air nozzles 69, 70 spaced from one another by a distance corresponding to the distance a, the flat belt 21 being moved forwards by four times the distance a. In this way four holders can simultaneously be attached to the transporting means and removed therefrom and four IC's 5 can be tested concurrently. By means of a path sequence memory and control means, IC's 5 of different grades can, after unloading, be removed in a manner not shown.

Figure 10:
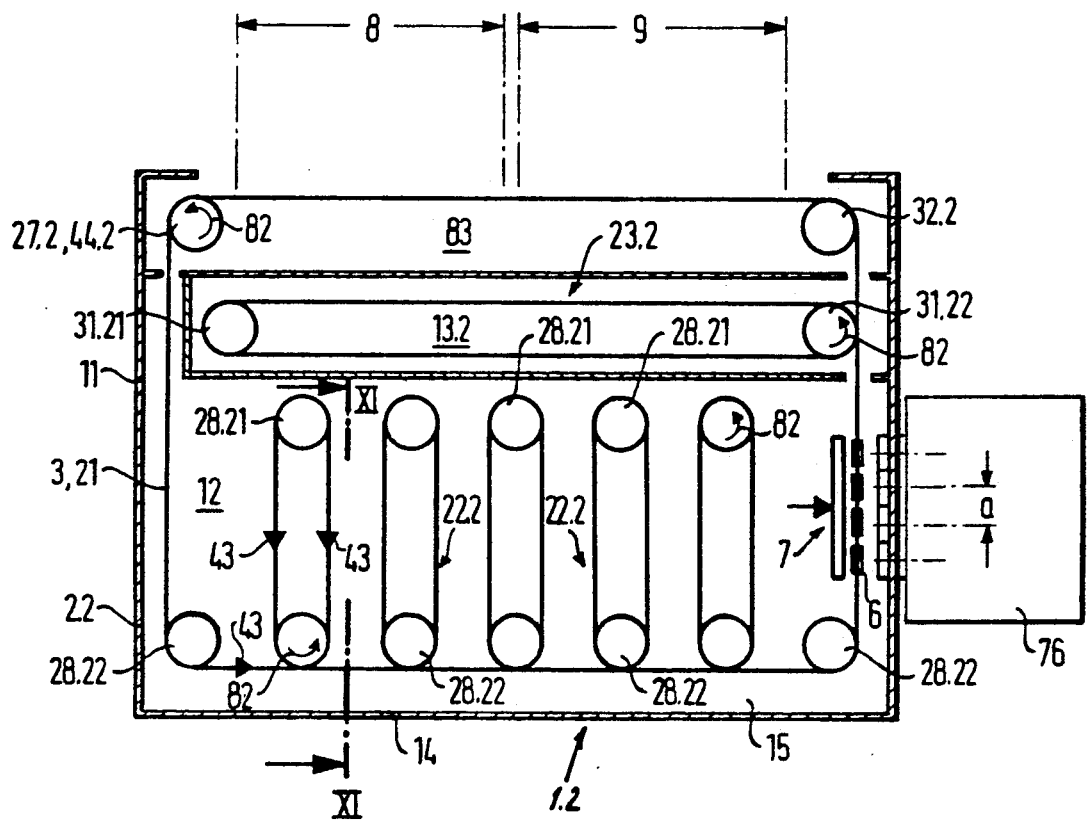
FIG. 10 shows a diagrammatic, sectional side elevation of a second exemplary embodiment of an apparatus according to the invention for testing electronic components.
Figure 11:
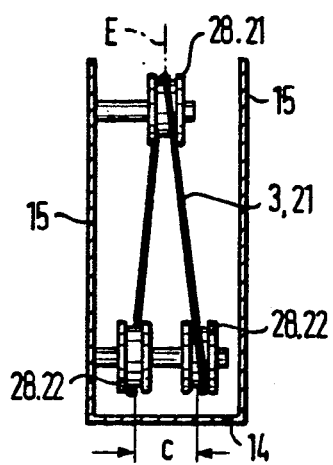
FIG. 11 shows a section along the line XI—XI in FIG. 10.

The apparatus 1.2 according to the second exemplary embodiment shown in FIGS. 10 and 11 corresponds substantially to the apparatus 1.1 shown in FIG. 1, having a housing 2.2 of which the lower part forms an air-conditioned chamber 12 of the same shape as the air-conditioned chamber shown in FIG. 1 but has a different roller arrangement 28.2. A further difference from FIG. 1 is that here the acclimatization chamber indicated by the reference numeral 13.2 is arranged between the air-conditioned chamber 12 and the open-topped chamber 83 in which the loading station 8 and the unloading station 9 are located and likewise has a different roller arrangement 31.2. The chambers 13.2 and 83 form the upper part of the housing 2.2 and have substantially the same length and width as the air-conditioned chamber 12.

Arranged in the open-topped chamber 83 are the horizontally aligned lead-out and lead-in rollers, here indicated by the reference numerals 27.2 and 32.2, which divert the transporting means 3 from the loading station 8 into the air-conditioned chamber 12 and from the acclimatization chamber 13.2 into the chamber 83 to the unloading station 9. The lead-out roller 27.2 is at the same time formed as a driving roller 44.2.

In the air-conditioned chamber 12 the rollers 28.2 are likewise arranged as spaced first rollers 28.21 in an upper row, and as second rollers 28.22 in a lower row. Each roller 28.21 of the upper row, together with two respective rollers 28.22 of the lower row, forms a roller group. The rollers 28.2 of each roller group are aligned horizontally in a vertical plane extending transverse to the longitudinal direction of the housing, with a distance c between the centres of the coaxial rollers 28.22 of the lower row. This prevents self-obstruction of the transporting means 3 loaded with the holders 6 as it passes through the respective loop 22.2. The planes E in which all the rollers 28.21 of the upper row rotate divide in half the distance c between the planes in which the rollers 28.22 of the lower row rotate.

The transporting means 3 passes around the rollers 28.2 of each roller group in a vertically aligned, spiral, closed loop 22.2, i.e. as it passes through in the direction 43 it runs over one of the two rollers 28.22 of the lower row, then over the roller 28.21 of the upper row and finally over the other of the two rollers 28.22 of the lower row and then to the roller 28.22 of the lower row of the next roller group that is arranged directly behind it and spaced by the same amount from the side wall 15 of the housing 2.2. All the rollers 28.2 in the air-conditioned chamber 12, like those in the acclimatization chamber 13.2 and the rollers 31.2 and 27.2, 32.2 in the open-topped chamber 83, have the same direction of rotation 82, which is counter-clockwise. Arranged before the first and after the last group of rollers in the air-conditioned chamber 12 there is a respective further roller 28.22 at the height of the lower row.

In the acclimatization chamber 13.2 three rollers 31.2 are arranged in a roller group combined in the same way as the roller groups 31.21, 31.22 in the air-conditioned chamber 12, but in a horizontal plane, so that the transporting means 3 passing around them forms a horizontal loop 23.2 extending the entire length of the acclimatization chamber 13.2.

Figure 12:
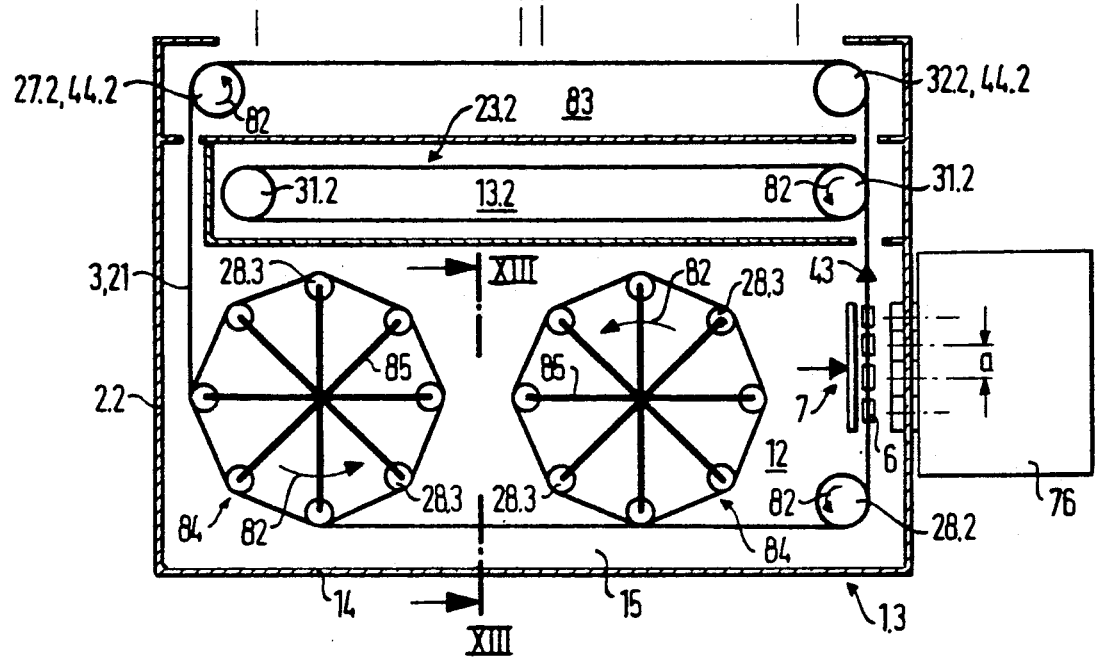
FIG. 12 shows a diagrammatic, sectional side elevation of a third exemplary embodiment of an apparatus according to the invention for testing electronic components.
Figure 13:
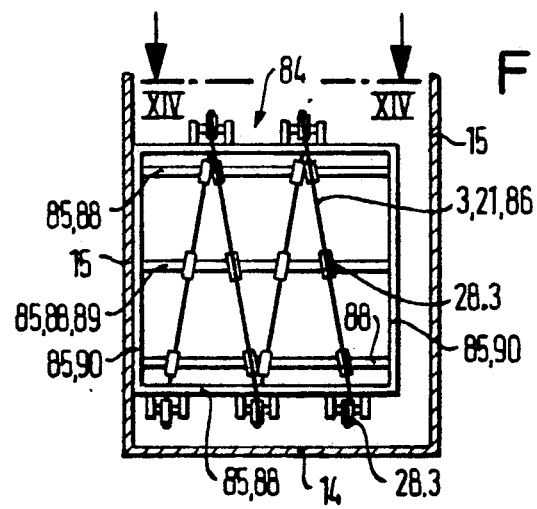
FIG. 13 shows a section along the line XIII—XIII in FIG. 12.
Figure 14:
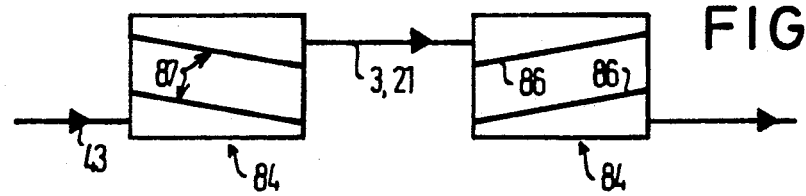
FIG. 14 shows a section along the line XIV—XIV in FIG. 13 in a diagrammatic representation.

The apparatus 1.3 according to the third exemplary embodiment shown in FIGS. 12 to 14 corresponds substantially to the apparatus 1.2 shown in FIGS. 10 and 11, having the same air-conditioned chamber 12, the same acclimatization chamber 13.2 and the same open-topped chamber 83 in the same housing 2.2, but with a different roller arrangement. This different roller arrangement includes two star-shaped roller carriers 84 with radially extending arms 85 on the free ends of which the rollers 28.3 are mounted rotatably and are arranged with a suitable inclination along a spiral 86 extending twice around the roller carrier periphery. In this way the transporting means 3 likewise passes through a respective closed, helical loop 87. Each arm 85 comprises a cross-strut 88 serving as an axle for the roller 28.3 mounted to rotate freely thereon, which is supported by two support struts 90 attached to the axle 89 of the roller carrier. The transporting means 3 runs from the lead-out roller 27.2 into the open-topped chamber 83, to the first and then to the second roller carrier 84, to be guided by it over a roller 28.2 in the manner already described for the second exemplary embodiment into the acclimatization chamber 13.2 and into the open-topped chamber 83. All the rollers 27.2, 28.2, 28.3, 31.2 and 32.2 have the same direction of rotation 82, which is counter-clockwise. In this exemplary embodiment the rollers 27.2 and 32.2 form the driving rollers.

Figure 15:
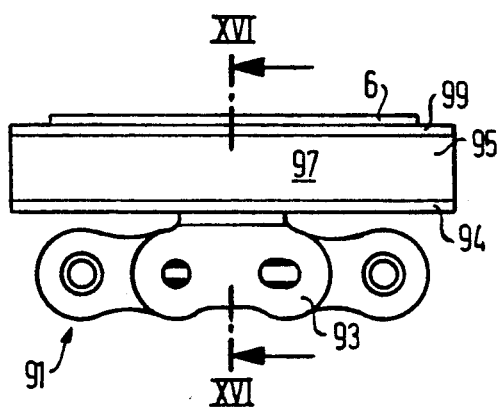
FIG. 15 shows a side elevation of a detail corresponding to FIG. 2 of a second embodiment.
Figure 16:
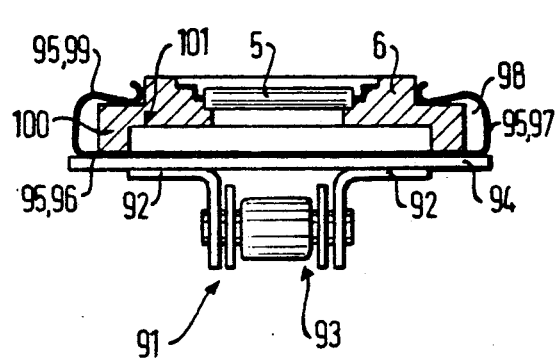
FIG. 16 shows a section along the line XVI-XVI in FIG. 15.

The transporting means 3 according to the second embodiment shown in FIGS. 15 and 16 is a simple roller chain 91 with double-sided bent lug link plates 92 which can be guided over both rollers and toothed wheels, neither of which is shown. To each of the bent lug link plates 92 of chain links 93, spaced apart by the distance a, a respective support plate 94 for the first engagement element 95 in the form of an undercut, T-shaped groove element is attached in a manner not shown. The groove element 95 is made of spring steel sheet and comprises a bottom part 96 and two groove walls 97 extending transverse to the longitudinal direction of the chain 91, and adjoining these are two inwardly pointing limbs 99 forming recesses 98. The lower part of the holder 6 forms, together with two lateral, integral projections 100, the second engagement element 101. The holder 6 carrying the electronic component 5 is pushed into the groove element 95 up to a stop (not shown), the projections 100 being arranged within the recesses 98 and held up against the bottom part 96 by the resilient limbs 99. To secure the holder 6 laterally the distance between the free ends of the limb 99 is substantially the same as the width of the holder above the projections 100.

The groove element 95 is attached detachably to the support plate 94, preferably by two resilient clamps (not shown), which elastically embrace the transverse edges of the support plate. To secure the groove element 95 in position on the support plate 94 locking projections and/or locking depressions can be provided in both components.

What is claimed is:

1. An apparatus for testing electronic components, including a transporting means; holders for the components; fastening means detachably attaching said holders to the transporting means, said transporting means being passed through a loading station to receive the components, a testing station for testing the components and an unloading station for removing the components therefrom, the holders together with the components being attached in the loading station to the transporting means and removed therefrom in the unloading station, said holders having shafts with open tops to receive the components, and each respective component accommodated in an associated holder being secured by two securing arms arranged opposite one another relative to the shaft which slightly overlap the component and are outwardly bendable transversely of the shaft.

2. An apparatus according to claim 1, wherein said component is quadrangular and is provided with contact elements about the entire periphery exclusive the corners thereof, said securing arms being arranged on opposite corners of the complementary configured shaft.

3. An apparatus according to claim 2, wherein said securing arms each extend in a space in a carrier body of said transporting means and through an opening in the shaft wall into the shaft.

4. An apparatus according to claim 1, wherein recesses are arranged on the outer peripheral edge of said shaft and extending transverse to the peripheral edge to receive the contact elements on the component.

5. An apparatus according to claim 1, wherein a gap is provided between substantially flat walls on the shaft and the component; and vertical ribs in at least two opposite corners of the shaft, said vertical ribs having angular guide surfaces on facing sides thereof with leading-in slopes for the fading corners of the components.

* * * * *